(12) United States Patent
Ramm et al.

(10) Patent No.: US 9,873,850 B2
(45) Date of Patent: Jan. 23, 2018

(54) ARC PVD COATING WITH ENHANCED REDUCING FRICTION AND REDUCING WEAR PROPERTIES

(71) Applicant: Oerlikon Surface Solutions AG, Trubbach, Trubbach (CH)

(72) Inventors: Jurgen Ramm, Maienfeld (CH); Matthias Lukas Sobiech, Wasserburg (DE); Florian Seibert, Sevelen (CH); Beno Widrig, Bad Ragaz (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 408 days.

(21) Appl. No.: 14/424,584

(22) PCT Filed: Jul. 25, 2013

(86) PCT No.: PCT/EP2013/002217
§ 371 (c)(1),
(2) Date: Feb. 27, 2015

(87) PCT Pub. No.: WO2014/032753
PCT Pub. Date: Mar. 6, 2014

(65) Prior Publication Data
US 2015/0203777 A1   Jul. 23, 2015

(30) Foreign Application Priority Data

Aug. 29, 2012 (DE) .................. 10 2012 017 033
Nov. 24, 2012 (EP) .................... 12007926

(51) Int. Cl.
F16C 33/12    (2006.01)
F16C 33/20    (2006.01)
(Continued)

(52) U.S. Cl.
CPC ........ *C10M 103/06* (2013.01); *C10M 103/04* (2013.01); *C23C 14/024* (2013.01);
(Continued)

(58) Field of Classification Search
CPC .... F16C 33/12; C23C 14/325; C10M 2201/05
(Continued)

(56) References Cited

U.S. PATENT DOCUMENTS

| 4,992,153 A | 2/1991 | Bergmann |
| 5,707,748 A | 1/1998 | Bergmann |

(Continued)

FOREIGN PATENT DOCUMENTS

WO    2012/055485 A1    5/2012

OTHER PUBLICATIONS

International Search Report for PCT/EP2013/002217 dated Jan. 7, 2014.
(Continued)

*Primary Examiner* — Vishal Vasisth
(74) *Attorney, Agent, or Firm* — Pearne & Gordon LLP

(57) ABSTRACT

A coated body includes a body (1) with a body surface (3) and a coating system (20) deposited on at least a portion of the body surface (3). The coating system (20) includes at least one hard friction reducing coating deposited as an outermost layer (9) which exhibits droplets (10) at its surface. The outermost layer (9) includes molybdenum copper nitride and/or molybdenum nitride and copper nitride, and at least some of the droplets (10) consist mainly of copper. Preferably most of the largest droplets (10) consist mainly of copper.

23 Claims, 2 Drawing Sheets

(51) Int. Cl.
*H01T 14/00* (2006.01)
*H05H 1/48* (2006.01)
*C10M 103/06* (2006.01)
*C23C 14/02* (2006.01)
*C23C 14/06* (2006.01)
*C23C 14/32* (2006.01)
*C23C 28/04* (2006.01)
*C10M 103/04* (2006.01)

(52) U.S. Cl.
CPC .......... *C23C 14/06* (2013.01); *C23C 14/0641* (2013.01); *C23C 14/0676* (2013.01); *C23C 14/325* (2013.01); *C23C 28/042* (2013.01); *C23C 28/044* (2013.01); *C10M 2201/053* (2013.01); *C10M 2201/0613* (2013.01)

(58) Field of Classification Search
USPC .......................................... 508/103; 427/580
See application file for complete search history.

(56) References Cited

U.S. PATENT DOCUMENTS

| | | | |
|---|---|---|---|
| 6,827,976 | B2 | 12/2004 | Derflinger |
| 7,067,191 | B2 | 6/2006 | Derflinger |
| 2009/0269615 | A1* | 10/2009 | Ramm ................. C22C 1/0416 428/697 |
| 2013/0303414 | A1* | 11/2013 | Ramm ................ C23C 14/0084 508/108 |

OTHER PUBLICATIONS

Pappacena, et al., "Residual Stresses, Interfacial Adhesion and Tribological Properties of MoN/Cu Composite Coatings", WEAR Elsevier Sequoia, Lausanne, CH, vol. 278, Jan. 3, 2012, pp. 62-70.

Shin et al., "Microstructural Evolution and Tribological Behavior of MoCuN Coatings as a Function of Cu Content", Materials Chemistry and Physics, Elsevier SA, Switzerland, TAiwan, Republic of China, vol. 130, No. 3, Aug. 7, 2011, pp. 870-879.

Ozturk, et al., Comparative Tribological Behaviors of TiN?, CrN? and MoN?Cu Nanocomposite Coatings, Tribology International, Butterworth Scientific LDT, Guildford, GB, vol. 41, No. 1, Sep. 19, 2007, pp. 49-59.

Seibert, et al., Comparison of Arc Evaporated Mo-based Coatings Versus Cr1N1 and ta-C Coatings by Reciprocating Wear Test, WEAR, vol. 298-299, Feb. 1, 2013, pp. 14-22.

"Copper—Element Information, Properties and Uses", Periodic Table, article can be found online: http://www.rsc.org/periodic-table/element/29/copper, accessed on Sep. 11, 2017.

"Molybdenum—Element Information, Properties and Uses", Periodic Table, article can be found online: http://www.rsc.org/periodic-table/element/42/molybdenum, accessed on Sep. 11, 2017.

* cited by examiner

ARC PVD COATING WITH ENHANCED REDUCING FRICTION AND REDUCING WEAR PROPERTIES

This application is a 371 of PCT/EP2013/002217, filed Jul. 25, 2013.

The present invention relates to a coating system for wear protection of components used in tribological systems. This coating system is particularly beneficial for reducing surface wear and increasing service life if wear mechanisms occurring during tribological contact at the component surface are strongly influenced by the initial frictional response. Furthermore, the present invention relates to a method for manufacturing wear resistant components whose surface is at least partially coated with a coating system according to the present invention.

STATE OF THE ART

Tribology is the branch of science and technology concerned with interacting surfaces in relative motion. Relative motion between two surfaces in contact with each other involves always friction and wear. Technically, each movable assembly can be seen as a tribological system.

A tribological system consists essentially of the contact surfaces of two bodies that are in moving contact with each other. A medium (usually a fluid) may be arranged between the surfaces of the two bodies in relative motion and their surroundings. Type, progress and extent of wear occurring at the surfaces of the bodies during tribological contact depend for most cases on the material and surface-finish of the respective surfaces, as well as on the intermediate materials arranged between the surfaces, the surrounding environment and in general on the operating conditions.

In the context of the present invention the bodies involved in tribological contact will be referred to as components. Particularly if the tribological operation is a cutting operation, the components would be a cutting tool and a workpiece, which are also frequently referred to as body and antibody, respectively. In such a case, the surroundings are usually air comprising oxygen- and water vapor and the medium between the surfaces of the cutting tool and the work-piece, respectively is usually a lubricant and/or a coolant.

For improving cutting performance and increasing service life of the cutting tools, the use of wear protection coatings is state of the art.

U.S. Pat. No. 5,707,748 described a tool coated with a coating system which helps for reducing formation of material built-up on the cutting edges. The coating system comprises a hard layer and a friction reducing layer. The hard layer without the friction reducing layer would tend to form material built-upon at the cutting edges. Particularly suitable materials for the formation of the friction reducing layer are carbon-based materials made by known vacuum deposition procedures such as evaporation, ion plating and sputtering PVD procedures. Such a friction reducing layer should be preferably deposited using a coating method described in U.S. Pat. No. 4,992,153 (a method which combines sputtering and chemical vapor deposition techniques). The thickness of the friction reducing layer should be about one-third of the thickness of the hard layer. The tool claimed in U.S. Pat. No. 5,707,748 comprises a tool body with at least one area to be exposed to wear and a coating system on at least the area to be exposed to wear, which is coated by a vacuum procedure, the coating system consists essentially of at least one hard layer lying directly on the tool body, and at least one superimposed exterior friction reducing layer on the hard layer, the friction reducing layer being a mixture of metal carbide and carbon, and being made so as to be free of any halide, a grain size of the hard and friction reducing layers have a linear average width of less than 1 μm, the friction reducing layer has a lower thickness than the hard layer.

A similar coating system is proposed in U.S. Pat. No. 7,067,191, which essentially differs from the coating system proposed in U.S. Pat. No. 5,707,748 by the addition of a metallic intermediate layer between the hard layer and the friction reducing layer. According to the description, such a layer system should be particularly advantageous for tools or machine components operated under insufficient lubrication or under dry operation conditions. The proposed coating system comprises a hard substance layer system, starting from the base body, subsequently a metallic layer and finally a slide layer system. The slide layer system is made (similarly to the friction reducing layer in U.S. Pat. No. 5,707,748) of carbide, especially of tungsten carbide or chromium carbide and dispersed carbon. A method for manufacturing a coated tool or machine component according to U.S. Pat. No. 7,067,191 is proposed and claimed in U.S. Pat. No. 6,827,976.

However, the coating systems according to the state of the art (mentioned above) as well as the coating production methods involve important disadvantages, such as:

1. The proposed coating production methods are complex and expensive because they comprise sputtering and chemical vapor deposition (CVD) processes for the formation of the friction reducing layer or slide layer system, respectively.
2. The carbon containing friction reducing layer or the slide layer system comprised in the proposed coating systems cannot be properly produced by means of less complex and less expensive coating methods such as physical vapor deposition (PVD) methods of the type cathodic arc evaporation. Moreover, if a cathodic arc evaporation process is used for the formation of the friction reducing layer or slide layer system, it would be not really possible to avoid the incorporation of hard macro-particles (droplets) in this layer or layer system if a droplets filter is not used. The droplets are macro-particles which could not react completely with the reactive gas contained in the coating chamber. Consequently, droplets consist at least mainly of material which melted at the target surface and dropped off from the target surface if the target is used as material source and cathode for the arc evaporation for the formation of the coating layer or layer system. These droplets incorporated in the outermost layer of the coating system result in an unacceptable roughness and consequently unacceptable friction and wear.
3. The carbon containing layers or layer systems mentioned in the state of the art are materials which belong to the family of the so called diamond like carbon (DLC) materials and can therefore react unfavorable with some substances contained in lubricants and coolant solutions.
4. Carbon materials doped with tungsten carbide (commonly referred to as WC/C or a-C:H:WC or a-C:H:W) are extremely hydrophilic. Consequently, extensive cleaning procedures of the coating chamber and the substrate holders between coating batches are required for assuring the reproducibility of the coating conditions.

5. Carbon-containing materials show an increased and uncontrollable reactivity with oxygen if they are exposed to elevated temperatures (of about 400° C. or higher) in oxygen-comprising atmospheres.

WO2012055485 reports about a molybdenum nitride coating which was deposited by means of cathodic arc PVD techniques on an unspecified substrate using a 300 nm thick layer as adhesion layer between the substrate and the molybdenum nitride layer. This molybdenum nitride layer exhibited very high hardness (HV 3000±500), low roughness (Rz=1.07 μm and Ra=0.13 μm) and was suitable for preventing material transfer in a reciprocating wear test (SRV test) which was performed against 100Cr6 at not specified temperatures. Additionally, it was indicated that by embedding small portions of molybdenum nitride in another nitride coating it would possible to create new nitride coatings comprising molybdenum nitride which could have similar properties like the original base nitride but exhibiting better performance and least regarding prevention of material transfer from the work-piece surface to the component surface, e.g. the cutting edge of a insert. Furthermore, it was reported that molybdenum nitride coatings can oxidize in an uncontrollable manner upon increased temperatures. For avoiding or retarding the appearance of this phenomenon it was recommended to replace molybdenum nitride with molybdenum monoxide at least in part and/or to use a molybdenum monoxide top layer.

The Mo—N—O system described in WO2012055485 is suitable for many applications. It has, however, a disadvantage that is common to all coatings which are synthesized by non-filtered arc evaporation: the incorporation of droplets in the coating and the rather high surface roughness associated with this. These droplets exhibit a high hardness and a very good adherence to the coating matrix. Because of that, these droplets are especially critical during initial contact between tool and work-piece, like it is the case for all PVD hard coatings having hard droplets at the surface of the outermost layer.

In the initial phase of the tribological contact, the hard and abrasive droplets support the material transfer from the work-piece to the tool causing at least two negative consequences:

1) On the one hand, the better lubrication conditions which are characteristic for the Mo-based materials (as it is described in WO2012055485) are inhibited to some extent.
2) On the other hand, the initial frictional response changes for the worse when the droplets quarry out or crumble away from the coating as a consequence of the tribological contact and thereby increasing the risk of cracking in the coating.

For this reasons, a surface post-treatment of these Mo-based coatings for removing droplets or smoothing the coating surface is generally beneficial just as it is beneficial for almost all coatings deposited by cathodic arc PVD techniques without using filters for avoiding droplet incorporation in the coating. In some cases, a polishing or burnishing treatment after coating becomes to be even indispensable. However, these post treatments create additional costs and require generally at least one more process step.

Objective of the Present Invention

The main objective of the present invention is to provide a coating system for wear protection of components whose surfaces are exposed to wear in tribological systems. In particular, this coating system should increase quality, wear resistance and service life of surfaces exposed to tribological wear in tribological systems, in which a reduction of the initial frictional response is especially beneficial.

Further, a coating system according to the present invention should provide protection against adhesive wear. Particularly, this coating system should provide enhanced performance and wear protection for tools used in cutting or forming operations in which the work-piece material has tendency to smear on the tool surface or has galling tendency.

Particularly, these coating systems should be able to be utilized at elevated temperatures of about 400° C. or higher, more preferably of about 500° C. or higher, and should exhibit high hardness of about 15 GPa or higher, preferably of about 20 GPa or higher, more preferably of about 30 GPa or higher and prevent the material transfer from work-piece to the component or tool.

A further objective of the present invention is to provide a method for manufacturing coated components having a coating system as mentioned above. The coating system should be deposited on at least a portion of the component surface to be exposed to tribological contact. Furthermore, the present invention provides a method for manufacturing of cathodic arc coated surfaces which do not require a surface post-treatment (neither by means of mechanical nor by means of chemical post-treatments) in order to remove droplets or to reduce surface roughness after coating with the intention of diminishing initial wear produced at the tribological contact area during operation. Against the above background it also follows that the present invention can be understood as a method to realize initiation of "surface polishing" during onset of tribological contact by removing droplets at this initial contact without initiating cracking of the coating. Thus the surface of the coated component is intrinsically self-conditioned for the subsequent tribological operation.

DESCRIPTION OF THE PRESENT INVENTION

Figure 1:
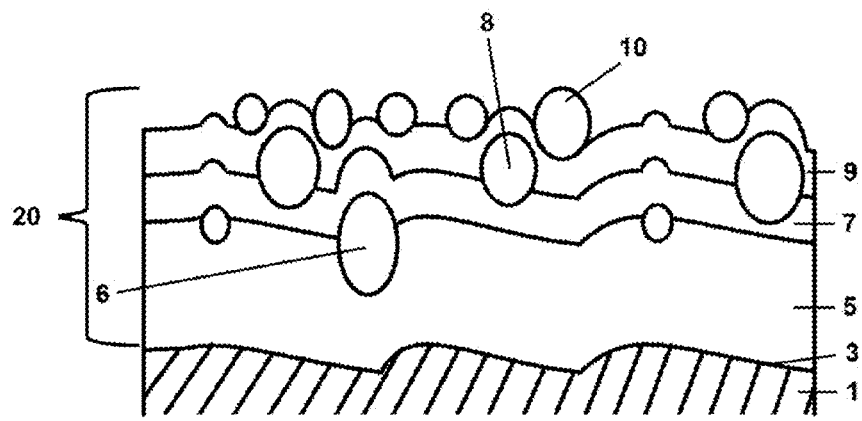
FIG. 1 shows a body coated with a coating system according to the present invention.
Figure 2:
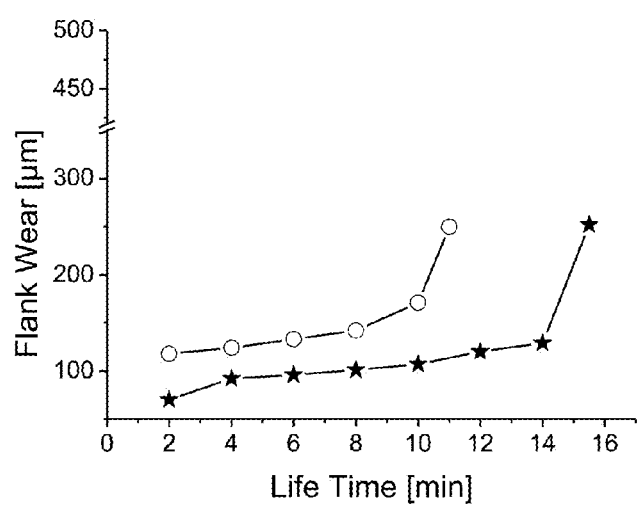
FIG. 2 shows the development of flank wear measured during cutting tests of two different cutting inserts.
Figure 3:
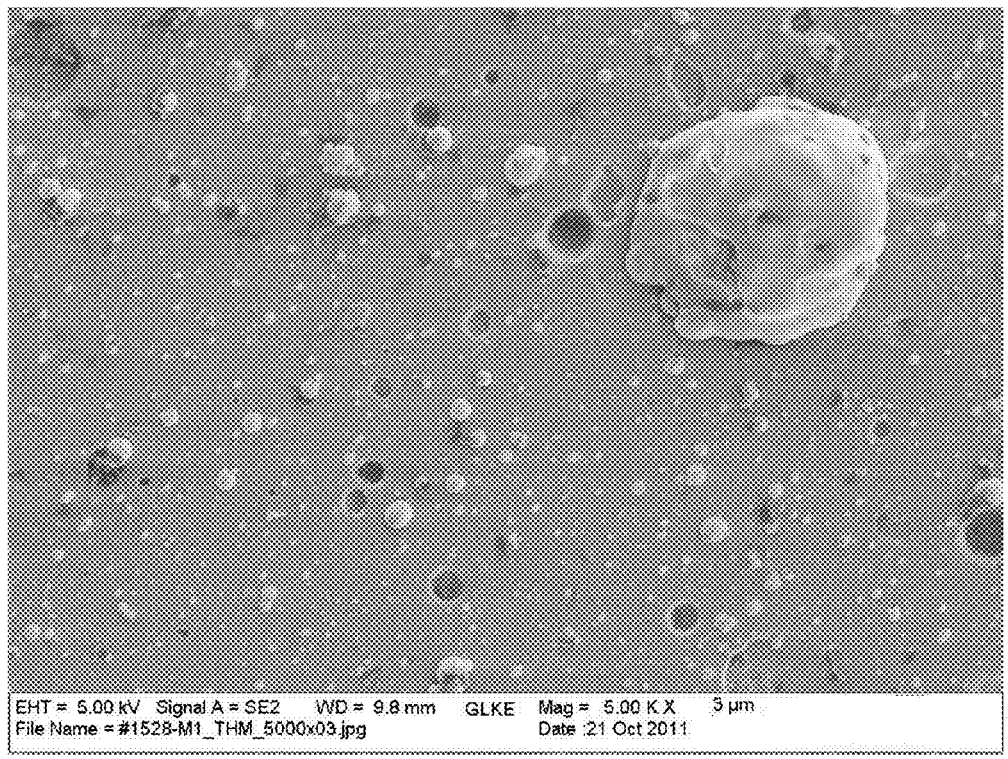
FIG. 3 shows a scanning electron microscopy (SEM) micrograph of the surface of a hard friction reducing layer.

In order to explain the present invention, the description of the invention will be supported by the FIGS. 1, 2 and 3. FIG. 1 shows a draft (not scaled dimensions) of a body 1 coated with a coating system 20 according to the present invention. In this draft the dimensions do not correspond necessarily with a real case. Particularly, the dimensions and distribution of the droplets were exaggerated in order to explain the idea better. FIG. 2 shows the development of the flank wear measured during cutting tests of two different cutting inserts. The resulted flank wear development plotted with circles corresponds to an insert which was coated with a coating according to the state of the art. The resulted flank wear development plotted with stars corresponds to another insert which was coated with a coating system according to the present invention. FIG. 3 shows a scanning electron microscopy (SEM) micrograph of the surface of a hard friction reducing layer 9 with droplets 10 consisting mainly of copper or being copper-rich according to the present invention. Copper-rich in the context of the present invention means that the copper content with respect to the molybdenum content in atomic percentage is larger than 3 at. %, i.e. is higher than the solubility of copper in molybdenum.

The main objective of the present invention is attained by providing a coated body 1 comprising a body surface 3 and a coating system 20 deposited on at least a portion of the body surface, said coating system comprising at least a hard friction reducing layer 9 deposited as outermost layer, the outermost layer comprising molybdenum copper nitride and/or molybdenum nitride and copper and/or copper nitride, and droplets 10 which mainly consist of copper.

The main objective of the present invention is also attained by providing a coated body 1 comprising a body surface 3 and a coating system 20 deposited on at least a portion of the body surface, said coating system comprising at least a hard friction reducing layer 9 deposited as outermost layer, the outermost layer comprising molybdenum copper nitride and/or molybdenum nitride and copper and/or copper nitride, and droplets 10 which partially consist of copper. Preferably, the droplets 10 are copper-rich, more preferably the droplets 10 has a copper content in atomic percentage with respect to molybdenum between 3 and 30 at. % or more.

The further objective of the present invention is attained by providing a method of manufacturing a coated body 1 at which the outermost layer 9 is formed by means of non-filtered reactive, cathodic arc PVD techniques, i.e. no effort is made to suppress the droplet production in this deposition method. The outermost layer comprising molybdenum copper nitride (and/or molybdenum nitride and copper and/or copper nitride) and droplets 10 consisting mainly of copper or being copper-rich, preferably containing copper in a concentration in atomic percentage with respect to molybdenum between 3 and 30 at-% or more. The outermost layer 9 is produced using at least one target comprising molybdenum and copper which is operated as cathode in a nitrogen comprising atmosphere.

In a preferred embodiment of a method of manufacturing a coated body according to the present invention, the outermost layer 9 is produced using at least one target comprising molybdenum and copper which is operated as cathode in a nitrogen comprising atmosphere, wherein the target mainly consists of copper or at least mainly comprises copper or is copper-rich.

In a further preferred embodiment of a method of manufacturing a coated body according to the present invention, the outermost layer 9 is produced using at least one target comprising molybdenum and copper which is operated as cathode in a nitrogen comprising atmosphere, wherein the target has a copper content in atomic percentage with respect to molybdenum between 3 and 30 at. %.

In one more preferred embodiment of a method of manufacturing a coated body according to the present invention, the outermost layer 9 is produced using at least one target comprising molybdenum and copper which is operated as cathode in a nitrogen comprising atmosphere, wherein the target has a copper content in atomic percentage with respect to molybdenum of 30 at. % or higher.

In a preferred embodiment of a coating system according to the present invention, the coating system 20 comprises a hard coating 5 and a hard friction reducing coating 9 that is deposited as outermost layer as it is showed in FIG. 1.

The hard coating 5 is preferably deposited by means of cathodic arc PVD techniques. The macro particles (droplets) 6 generated by this evaporation technique are embedded in the coating and/or are deposited on the coating surface. For this reason this hard coating can exhibit a high surface roughness of about $R_z$=1.5 µm or even larger.

In case of using cathodic arc PVD techniques these droplets 6 are produced during the arc operation process at the cathode surface by melting and evaporation of target material. In this case, the solid material source used for the coating production is also used as cathode and is commonly referred to as target. Consequently the droplets 6 in the coating and/or on the coating surface consist at least partially of target material which may have not been reacted completely with reactive gas during coating formation.

The hard coating 5 show typical roughness of at least Rz>1 µm, Ra>0.15 µm, but may exceed easily values of Rz>3 µm, Ra>0.4 µm for thicker layer since surface roughness of arc evaporated coatings is a cumulative effect and therefore thickness dependent. The hard friction reducing coating 9 deposited as an outermost layer has a lower friction coefficient under dry conditions with respect to steel (100Cr6) and comprises molybdenum-nitrogen chemical bonds, Mo—N, and copper. The copper can also be dissolved in the coating and may form chemical bonds with nitrogen, Cu—N. Predominant, however, copper exists in the outermost layer as a major constituent of the droplets 10 observed at the surface after coating with a concentration which is higher than the solubility of copper in molybdenum, i.e. which is higher than about 3 at. %.

In the context of the present invention the hard coating 5 exhibits a hardness of at least 15 GPa, preferably of about 20 GPa or higher, more preferably of about 30 GPa or higher. Furthermore, it is expected that a hard coating according to the present invention can be used as wear protection coating for tools and components because of its very good wear protection properties (particularly in terms of mechanical wear or rather abrasive wear). Preferably, a hard coating in the context of the present invention is chemically and thermally stable at elevated temperatures of about 400° C. or higher, more preferably of about 500° C. or higher.

Preferred embodiments of the present invention have at least one hard coating 5 consisting of or comprising:
- aluminum, titanium, nitrogen, and/or
- aluminum, chromium, nitrogen, and/or
- a metal oxide, and/or
- a metal oxynitride, and/or
- ta-C (tetrahedral amorphous carbon), and/or
- aluminum, titanium, silicon, nitrogen, and/or
- aluminum, chromium, silicon, nitrogen.

Optional, the coating system 20 can also comprise an additional hard frictional coating 7 between the hard coating 5 and the hard frictional coating 9.

Preferably, this hard frictional coating 7 comprises droplets 8 which comprise molybdenum and/or nitrogen, but no copper. In this case, the hard frictional coating 7 is produced from a molybdenum target which does not contain copper.

In the context of the present invention a hard friction reducing coating 7, 9 can have a similar hardness than the hard coating but additionally very good friction reducing properties. For this reason, molybdenum nitride comprising coatings are excellent hard friction reducing coatings in the context of the present invention.

In a preferred embodiment of the present invention the at least one hard friction reducing layer 7 comprises oxygen. Preferably, it comprises molybdenum monoxide.

Furthermore, a hard friction reducing coating according to the present invention, preferably, exhibit good chemical and thermal stability at elevated temperatures of about 400° C. or higher.

According to the present invention, the hard friction reducing coating deposited as outermost layer 9 must function as a hard matrix for the droplets 10 which consist mainly of soft copper or are copper-rich.

The outermost layer 9 has a thickness preferentially of at least the same magnitude or greater than the thickness of the largest droplet existing above the hard coating surface, although also smaller thickness can show a remarkable positive effect on the initial wear of the tool that is a considerable wear reducing effect.

Preferably, the outermost layer has a chemical composition (in at. %) given by the formula:

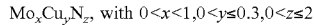

$Mo_xCu_yN_z$, with $0<x<1, 0<y\leq0.3, 0<z\leq2$

Very good results were obtained for example when the outermost layer 9 was prepared with a chemical composition $Mo_{0.85}Cu_{0.15}N_1$.

In addition, this compound may comprise another metal or metalloid or a mixture of metals or metalloids as dopant referred to as Me (e.g. Me=one or more elements chosen from Ag, Sn, Zn, Au, Cr, Si, W) as well as another non-metal referred to as X (e.g. X=oxygen). In this cases, if the dopant element or a mixture of elements is added the outermost layer has a chemical composition (in at. %) given by the formula:

$Mo_xCu_yMe_wN_zX_v$, with $0<x<1, 0<y\leq0.3, 0<z\leq2$, $0\leq w\leq0.3, 0\leq v\leq0.15$.

Main function of the outermost layer 9 according to the present invention is to reduce the initial friction response of the hard coating 5 and to reduce by this means the risk of layer cracking via loss of the hard droplets 6 in the hard coating 5 despite the high overall roughness of the coating system 20.

Furthermore, the outermost (run-in) layer 9 serves an agent to initiate surface polishing of hard layer 5 during onset of tribological contact, i.e. basically, the surface of the coated component is intrinsically self-conditioned for the subsequent tribological operation. In these cases the hard coating 5 is "polished" through the friction with the counterbody during the tribological contact in the tribological system by the lubricious action of the run-in layer 9. More precisely, the most of the largest droplets 10 consisting mainly of copper or being copper-rich (which are available on the surface of the outermost layer 9) are acting as a kind of solid lubricant and reduce the initial friction and according wear by dominating the first contact between the coated body 1 with the surface of the antibody. In addition, these droplets are only loosely incorporated in the coating matrix due to their high copper content which is higher than the solubility of copper in molybdenum. Therefore, coating failures caused by quarry out of hard droplets 6 or 8 from the hard coating 5 or hard friction reducing coating 7, respectively, or crumble away of hard droplets from the coating are essentially avoided or do not result in cracking failures. In addition to the initial friction reduction of the hard friction reducing coating 9 with droplets 10 consisting mainly of copper or being copper-rich, the combination of the friction reducing coating 7 and the friction reducing coating 9 has the additional function to increase the mechanical stability for the droplets 6 of the hard coating 5 and allowing a smoothening of the hard coating 5 without cracking the hard coating 5 by the loss of the droplets 6.

Example of cutting tool performance improvements attained by applying a coating system according to the present invention:

The influence of an outermost layer 9 applied according to the present invention on cutting tool performance is shown in FIG. 2. Cutting inserts were coated with 6 μm thick TiAlN coating (standard coating) in one case and (4 μm TiAlN+1 μm MoN+1 μm MoCuN) coating (example for the coating system 20 according to the invention) in the other case. No post-treatment of the cutting insert surface was performed for both samples. For both cutting inserts, cutting tests were performed in outside plain turning without coolant and using 1.1191 steel (C45) as work-piece material. A cutting speed of 240 m/min was utilized with the feed rate of 0.3 mm/rev and a depth of cut of 2 mm. The wear of the flank face was measured by optical microscopy and plotted against the operation time of the insert. The development of the flank wear of the standard coating was plotted using circles. These inserts show high initial wear (above 100 μm) and a tool life of only about 11 min. In contrast to this, the cutting insert according to the invention (plotted with stars) has drastically reduced initial flank wear (below 80 μm) resulting in an increased tool life of nearly 16 min. The total of the two inserts were about the same, but for the inserts according to the invention for which the outermost layer having droplets mainly consisting of copper the stability of the coating was improved.

Fundamentally, the present invention provides a coated body comprising a body 1 with a body surface 3 and a coating system 20 deposited on at least a portion of the body surface 3. The coating system 20 comprising at least one hard friction reducing coating deposited as an outermost layer 9 which exhibits droplets 10 at its surface. The coating outermost layer 9 is particularly characterized by:

- the outermost layer 9 comprises molybdenum copper nitride and/or molybdenum nitride and copper and/or copper nitride, and
- at least some of the droplets (10) consist mainly of copper or are copper-rich.

Preferably, most of the largest droplets (10) consist mainly of copper or are copper-rich. It means that the droplets 10 exhibited at the surface of the outermost layer 9 can comprise different elements or compounds such as molybdenum and/or copper and/or molybdenum nitride and/or cooper nitride and/or molybdenum copper nitride. However, if the surface of the outermost layer 9 is observed (e.g. using scanning electron microscopy techniques), droplets 10 having largest size can be observed and according to the present invention, at least the majority of these largest droplets 10 size consist mainly of cooper or are copper-rich. The copper content of these droplets is at least larger than the solubility of copper in molybdenum, i.e. larger than about 3 at. % with respect to the molybdenum content. This ensures a loosely adherence of the droplets to the coating matrix and reduces the risk of cracking failures.

In the context of the present invention, droplets having largest size are also referred to as largest droplets. These largest droplets are characterized by having a nearly spherical shape with diameters in the micrometer range, but may also have larger diameters up to about 5 to 10 micrometer, as depicted in FIG. 3.

The outermost layer (9) has preferably a chemical composition (in at. %) given by the formula: $Mo_xCu_yN_z$, with $0<x<1, 0<y\leq0.3, 0<z\leq2$

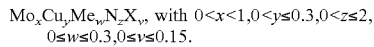

The outermost layer (9) can additionally comprise another metal or metalloid or a mixture of metals and/or metalloids as dopant referred to as Me (e.g. Me=one or more elements chosen from Ag, Sn, Zn, Au, Cr, Si, W). The outermost layer (9) can also comprise another non-metal or a mixture of non-metals referred to as X (e.g. X=oxygen) and has in this case a chemical composition (in at. %) given by the formula: $Mo_xCu_yMe_wN_zX_v$, with $0<x<1$, $0<y\leq 0.3$, $0<z\leq 2$, $0\leq w\leq 0.3$, $0\leq v\leq 0.15$ The coating system (20) can comprise one or more hard coatings (5) deposited between the body surface (3) and the outermost layer (9).

The at least one hard coating (5) can consist of or comprise ta-C and/or titanium and/or aluminum and/or chromium and/or silicon and/or nitrogen and/or a metal oxide.

For some applications, the at least one hard coating (5) has preferably an overall hardness of at least 20 GPa. Such a hard coating (5) can be produced by vacuum deposition methods in which droplets are generated from the source material (target) during deposition process and incorporated in the coating. For this reason, such a hard coating (5) can exhibit hard droplets (6) at its surface.

Moreover, the coating system (20) can comprise one or more further hard friction reducing coatings (7) deposited between the body surface (3) and the outermost layer (9) or between the at least one hard coating (5) and the outermost layer (9).

Preferably, the at least one further hard friction reducing coating (7) consists of or comprises molybdenum nitride and/or molybdenum oxynitride and/or molybdenum oxide and/or molybdenum monoxide.

More preferably, the at least one further hard friction reducing coating (7) mostly comprises molybdenum nitride or consists essentially of molybdenum nitride, and has an overall hardness of at least 20 GPa and exhibits droplets (8) consisting mostly of molybdenum.

Furthermore, the coating system (20) can comprise one or more adhesion improving layer deposited directly on the body surface (3) and/or formed directly at the body surface (3) which increases the adhesion strength of the coating system (20) to the body surface (3).

Likewise, the coating system (20) can comprise one or more interlayers between the different kind of coatings (for example between 5 and 7 or between 7 and 9) which are forming the coating system (20). In this case, the interlayers are fundamentally intended for improving adhesion between the different kind of coatings and consequently for improving cohesion within the overall coating system (20) or at least within a portion of the coating system (20).

Preferably, the most of the largest droplets (10) consisting mainly of copper or are copper-rich are distributed along the surface of the outermost layer (9) in such a manner that an initial tribological contact of a surface of an antibody with a surface of the coated body which is coated with the coating system (20) would result at least mostly in a contact of the surface of the antibody with the largest droplets (10) which mainly consist of copper or are copper-rich.

According to the present invention, one or more of the coatings (5 or 7 or 9) comprised in the coating system (20) can be deposited by means of cathodic arc PVD techniques without using means for avoiding incorporation of droplets in the coating.

Likewise and in some cases even preferably, the overall coating system (20) can be deposited on the body surface (3) by means of cathodic arc PVD techniques without using means for avoiding incorporation of droplets in the coating. It makes possible to accomplish reliable coating processes that are at the same time inexpensive, uncomplicated and robust.

In particular, a coated body according to the present invention can be a component (e.g. an engine part or machine part) or a tool whose coated surface is to be at least partially exposed to tribological wear during a tribological operation.

More particularly, a coated body according to the present invention can be a cutting tool or a forming tool. For example, such a cutting tool or such a forming tool can be made of a material that consists of or comprises steel and/or cemented carbide and/or a ceramic compound (e.g. cermet) and/or cubic boron nitride.

According to the present invention such a coated component or tool can be used in applications in which the corresponding coated surface is at least partially exposed to tribological wear and at least temporarily exposed to elevated temperatures of 500° C. or more.

A preferred method of manufacturing a coated body according to the present invention includes the deposition of the outermost layer (9) by means of reactive, cathodic arc PVD techniques without using filters for avoiding incorporation of droplets in the coating. For the deposition of outermost layer (9) at least one target containing essentially molybdenum and copper must be utilized. Thus, largest droplets (10) consisting mainly of copper or being copper-rich are produced by melting and evaporation of material from the at least one target comprising molybdenum and copper which is operated as cathode in a nitrogen comprising atmosphere by arc operation. At the surface of the outermost layer (9), the quantity of the largest droplets (10) which consist mainly of copper or are copper-rich should be higher than the quantity of the other largest droplets (10) which do not consist mainly of cooper or which are copper-rich.

Preferably, at least the one target comprising molybdenum and copper used for producing the outermost layer (9) is made by powder metallurgy techniques.

In a preferred embodiment of a manufacture method of a coated body according to the present invention, the at least one molybdenum-copper target which is made by powder metallurgy contains mainly copper or is copper-rich.

In a preferred embodiment of a coated body according to the present invention, the concentration of copper in atomic percentage with respect to molybdenum in the outermost 10 nm region, preferably in the outermost 20 nm region of the layer (9) which are nearest to the surface, has a higher concentration in atomic percentage than the nominal target concentration.

According to a preferred method according to the present invention for synthesizing molybdenum copper coatings by cathodic arc evaporation a powder metallurgical produced target is used consisting mainly of molybdenum and copper with a copper concentration of more than 3 at. %, preferably more than 10 at. % with respect to molybdenum, characterized in that the surface of the said target is depleted in copper concentration with respect to the nominal concentration of the molybdenum-copper target. Such nominal concentration is for example existing in a distance from the surface greater than 300 μm.

What is claimed is:

1. Coated body comprising a body (1) with a body surface (3) and a coating system (20) deposited on at least a portion of the body surface (3), said coating system (20) comprising at least one hard friction reducing coating deposited as an outermost layer (9) which exhibits droplets (10) at its surface, characterized in that said outermost layer (9) comprises molybdenum copper nitride and/or molybdenum nitride and copper nitride, and at least some of the droplets (10) consist mainly of copper.

2. Coated body comprising a body (1) with a body surface (3) and a coating system (20) deposited on at least a portion of the body surface (3), said coating system (20) comprising at least one hard friction reducing coating deposited as an outermost layer (9) which exhibits droplets (10) at its surface, characterized in that said outermost layer (9) comprises molybdenum copper nitride and/or molybdenum nitride and copper or/and copper nitride, and at least some of the droplets (10) comprise copper and copper-rich molybdenum, wherein the copper content in atomic percentage with respect to molybdenum is higher than 3%.

3. Coated body according to claim 1, characterized in that the outermost layer (9) has a chemical composition in at. % given by the formula: $Mo_xCu_yMe_wN_zX_v$, with $0<x<1$, $0<y\le0.3$, $0<z\le2$, $0\le w\le0.3$, $0\le v\le0.15$, where Me is one or more elements chosen from Ag, Sn, Zn, Au, Cr, Si, W, and X is a non-metal or a mixture of non-metals.

4. Coated body according to claim 1, characterized in that the coating system (20) comprises at least one hard coating (5) deposited between the body surface (3) and the outermost layer (9).

5. Coated body according to claim 4, characterized in that the at least one hard coating (5) consists of or comprises ta-C and/or titanium and/or aluminum and/or chromium and/or silicon and/or nitrogen and/or a metal oxide.

6. Coated body according to claim 2, characterized in that the at least one hard coating (5) has an overall hardness of at least 20 GPa and exhibits droplets (6).

7. Coated body according to claim 1, characterized in that the coating system (20) comprises at least one further hard friction reducing coating (7) deposited between the body surface (3) and the outermost layer (9) or between the at least one hard coating (5) and the outermost layer (9).

8. Coated body according to claim 7, characterized in that the at least one further hard friction reducing coating (7) comprises molybdenum nitride and/or molybdenum oxynitride and/or molybdenum oxide and/or molybdenum monoxide.

9. Coated body according to claim 8, characterized in that the at least one further hard friction reducing coating (7) consisting essentially of molybdenum nitride, and has an overall hardness of at least 20 GPa and exhibits droplets (8) consisting mostly of molybdenum.

10. Coated body according to claim 1, characterized in that the coating system (20) comprises at least one adhesion improving layer deposited directly on the body surface (3) and/or formed directly at the body surface (3) which increases the adhesion strength of the coating system (20) to the body surface (3).

11. Coated body according to claim 1, characterized in that the most of largest droplets (10) consisting mainly of copper or being copper-rich are distributed along the surface of the outermost layer (9) in such a manner that an initial tribological contact of a surface of an antibody with a surface of the coated body which is coated with the coating system (20) would result at least mostly in a contact of the surface of the antibody with the largest droplets (10) which mainly consist of copper or are copper-rich.

12. Coated body according to claim 1, characterized in that at least one coating (5 or 7 or 9) comprised in the coating system (20) is deposited by means of cathodic arc PVD techniques without using means for avoiding incorporation of droplets in the coating.

13. Coated body according to claim 1, characterized in that the coating system (20) is deposited on the body surface (3) by means of cathodic arc PVD techniques without using means for avoiding incorporation of droplets in the coating.

14. Coated body according to claim 1, characterized in that the coated body is a component or a tool whose coated surface is to be at least partially exposed to tribological wear during a tribological operation.

15. Coated body according to claim 14, characterized in that the coated body is a cutting tool or a forming tool.

16. Coated body according to claim 15, characterized in that the cutting tool or the forming tool is made of a material that consists of or comprises steel and/or cemented carbide and/or a ceramic compound and/or cubic boron nitride.

17. Method of using a component or tool according to claim 14, comprising contacting a work-piece with the coated surface of the component or tool, in which said coated surface to be at least partially exposed to tribological wear is at least temporarily exposed to elevated temperatures of 500° C. or more.

18. Method of manufacturing a coated body according to claim 1, characterized in that the outermost layer (9) is deposited by means of reactive, cathodic arc PVD techniques without using filters for avoiding incorporation of droplets in the coating, and utilizing at least one target containing essentially molybdenum and copper wherein the largest droplets (10) consisting mainly of copper or being copper-rich are produced by melting and evaporation of material from the at least one target comprising molybdenum and copper which is operated as cathode in a nitrogen comprising atmosphere by arc operation.

19. Method according to claim 18, characterized in that the at least one target comprising molybdenum and copper used for producing the outermost layer (9) is a powder metallurgical manufactured target.

20. Method according to claim 19, characterized in that the at least one target consist at least mainly of cooper or is copper-rich.

21. Coated body according to claim 1, characterized in that, the concentration of copper in atomic percentage with respect to molybdenum in the outermost 10 nm region, preferably in the outermost 20 nm region of the layer (9) which are nearest to the surface, has a higher concentration in atomic percentage than the nominal target concentration.

22. A method for synthesizing molybdenum copper coatings by cathodic arc evaporation using a powder metallurgical produced target consisting of molybdenum and copper with a copper concentration of more than 3 at. %, characterized in that the surface of the said target is depleted in copper concentration with respect to the nominal concentration of the molybdenum-copper target.

23. The coated body according to claim 1, wherein most of the largest droplets (10) consist mainly of copper.

* * * * *